(12) United States Patent
Petry et al.

(10) Patent No.: US 9,933,314 B2
(45) Date of Patent: Apr. 3, 2018

(54) SEMICONDUCTOR WORKPIECE TEMPERATURE MEASUREMENT SYSTEM

(71) Applicant: Varian Semiconductor Equipment Associates, Inc., Gloucester, MA (US)

(72) Inventors: Klaus Petry, Merrimac, MA (US); Jason M. Schaller, Austin, TX (US); Ala Moradian, Beverly, MA (US); Morgan D. Evans, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/198,701

(22) Filed: Jun. 30, 2016

(65) Prior Publication Data
US 2018/0003567 A1 Jan. 4, 2018

(51) Int. Cl.
*G01K 5/48* (2006.01)
*G01B 11/00* (2006.01)
(Continued)

(52) U.S. Cl.
CPC ............. *G01K 5/486* (2013.01); *G01B 11/00* (2013.01); *H01J 37/3171* (2013.01);
(Continued)

(58) Field of Classification Search
CPC .... G01K 5/00; G01K 7/00; G01K 7/01; G01J 5/00; G01J 5/10; G01J 5/32; G01J 5/0007;
(Continued)

(56) References Cited

U.S. PATENT DOCUMENTS 3,930,684 A * 1/1976 Lasch, Jr. ............ H01L 21/6779
                                                      198/380
5,221,142 A * 6/1993 Snow ..................... G01K 5/52
                                                      374/120
(Continued)

FOREIGN PATENT DOCUMENTS

JP    2008-82928 A   4/2008
WO   93/21656 A1   10/1993

OTHER PUBLICATIONS

NN 85123010. Title: Wafer Pre-Align Station Capable of Pre-Aligning Various Wafer Sizes. No date.*
(Continued)

*Primary Examiner* — Gail Kaplan Verbitsky
(74) *Attorney, Agent, or Firm* — Nields, Lemack & Frame, LLC

(57) ABSTRACT

An improved system and method of measuring the temperature of a workpiece being processed is disclosed. The temperature measurement system determines a temperature of a workpiece by measuring the amount of expansion in the workpiece due to thermal expansion. The amount of expansion may be measured using a number of different techniques. In certain embodiments, a light source and a light sensor are disposed on opposite sides of the workpiece. The total intensity of the signal received by the light sensor may be indicative of the dimension of the workpiece. In another embodiment, an optical micrometer may be used. In another embodiment, a light sensor may be used in conjunction with a separate device that measures the position of the workpiece.

11 Claims, 6 Drawing Sheets

(51) Int. Cl.
  *H05B 1/02* (2006.01)
  *H05B 3/00* (2006.01)
  *H01J 37/317* (2006.01)

(52) U.S. Cl.
  CPC ......... *H05B 1/0233* (2013.01); *H05B 3/0047* (2013.01); *H01J 2237/2002* (2013.01); *H01J 2237/20221* (2013.01)

(58) Field of Classification Search
  CPC ........ H01L 21/67248; H01L 21/67115; G01N 21/9501; G01N 1/312; G01N 35/00029; G01N 35/1011; Y10S 134/902; B01J 2219/020628; B01J 19/0013; B01J 2219/00058; C01P 2006/32
  USPC ....... 374/121, 178, 45, 55, 153, 142; 385/12
  See application file for complete search history.

(56) References Cited

U.S. PATENT DOCUMENTS

| | | | |
|---|---|---|---|
| 5,258,823 A | 11/1993 | Akamatsu | |
| 5,322,361 A * | 6/1994 | Cabib | G01K 5/52 356/43 |
| 5,350,899 A * | 9/1994 | Ishikawa | G01J 5/0003 219/121.43 |
| 5,561,612 A * | 10/1996 | Thakur | C23C 16/46 374/121 |
| 6,162,008 A | 12/2000 | Perkins et al. | |
| 7,073,938 B2 * | 7/2006 | Gianchandani | G01K 7/028 374/167 |
| 8,130,362 B2 * | 3/2012 | Kawakubo | G03F 9/7003 355/52 |
| 8,658,937 B2 * | 2/2014 | Harte | B23K 26/0648 219/121.68 |
| 2002/0192847 A1 | 12/2002 | Ino et al. | |
| 2003/0206574 A1 * | 11/2003 | Yun | G01K 7/42 374/135 |
| 2005/0205807 A1 | 9/2005 | Perel et al. | |
| 2008/0002753 A1 * | 1/2008 | Timans | G01K 11/125 374/2 |
| 2008/0025368 A1 * | 1/2008 | Aderhold | G01J 5/0022 374/102 |
| 2008/0042078 A1 * | 2/2008 | England | H01J 37/20 250/492.21 |
| 2012/0113402 A1 * | 5/2012 | Cadee | G03F 7/70341 355/30 |
| 2012/0307216 A1 * | 12/2012 | Laurent | G03F 7/70875 355/30 |
| 2013/0287536 A1 * | 10/2013 | Koelmel | H01L 21/67259 414/754 |
| 2015/0092813 A1 * | 4/2015 | Timans | G01J 5/0003 374/45 |
| 2016/0041089 A1 * | 2/2016 | Hovinen | H01J 37/3053 250/341.8 |
| 2016/0172221 A1 * | 6/2016 | Takahashi | B24B 9/065 451/5 |
| 2016/0307726 A1 * | 10/2016 | Hatakeyama | G01N 23/2251 |
| 2017/0212429 A1 * | 7/2017 | Koevoets | G03F 7/70725 |

OTHER PUBLICATIONS

International Search Report and Written Opinion dated Aug. 28, 2017 in corresponding PCT application No. PCT/US2017/033990.

* cited by examiner

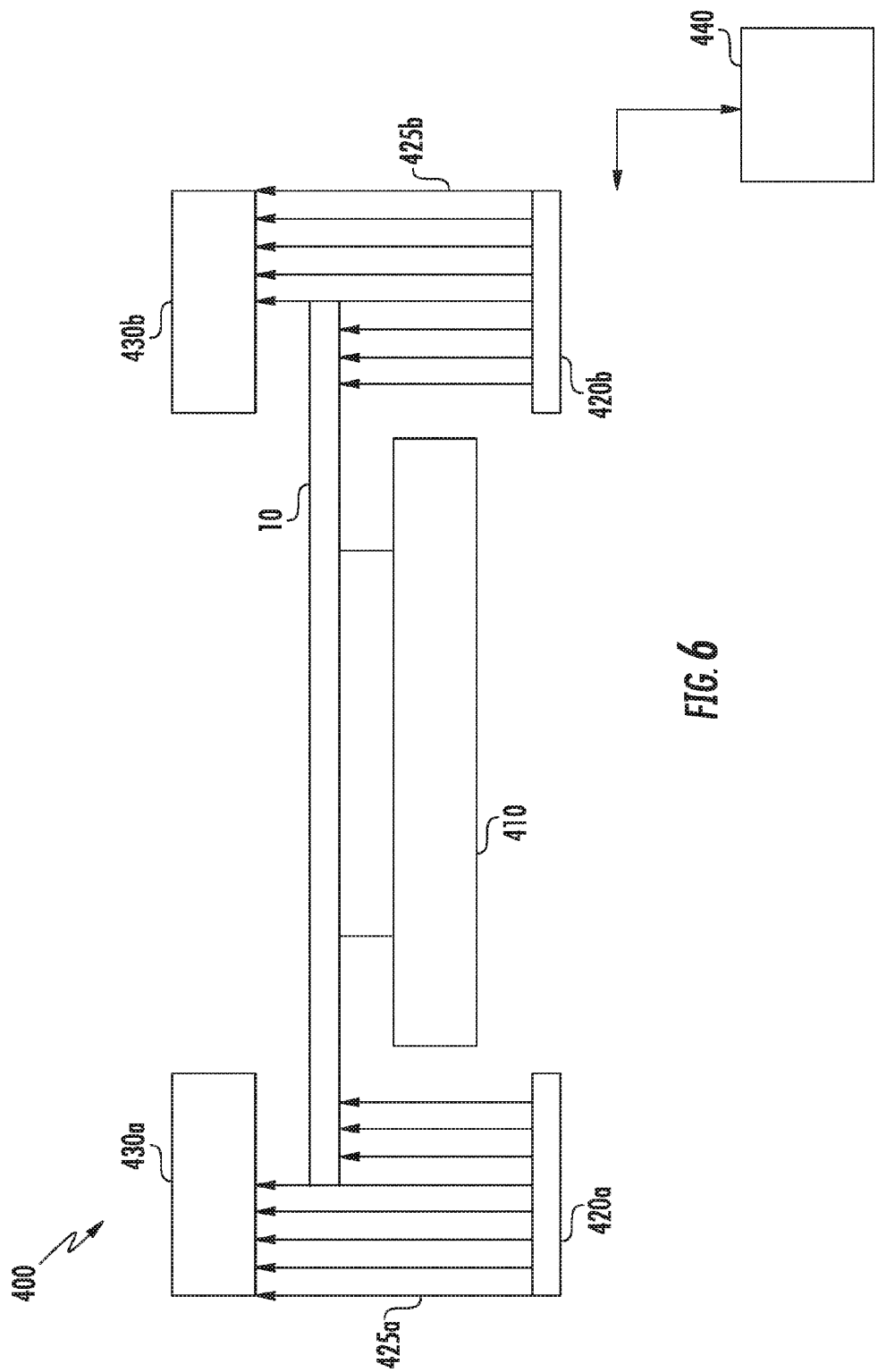

SEMICONDUCTOR WORKPIECE TEMPERATURE MEASUREMENT SYSTEM

FIELD

This disclosure relates to temperature measurement of workpieces, more particularly, to temperature measurements of silicon workpieces by measuring the expansion of the workpiece.

BACKGROUND

Many current semiconductor processes are performed at a temperature that is different than ambient temperature. For example, certain processes may be best performed in a cold environment, such as below 0° C., while others are best performed in a hot environment, such as above 500° C. Often, it is not the temperature of the ambient environment, but rather the actual temperature and/or the temperature uniformity of the workpiece that is of interest. Thus, monitoring the temperature of the workpiece itself may be beneficial.

Techniques for workpiece temperature measurement are limited by the processing environment. For example, thermocouples attached to the workpiece are impractical if the workpiece moves. Alternatively, thermocouples mounted to the supporting structure are of limited use, as the temperature of the supporting structure may differ from that of the workpiece due to problems associated with establishing good thermal contact between the supporting structure and the workpiece. Additionally, the optical properties of silicon make the application of common infrared techniques difficult or impossible. Additionally, in some embodiments, test workpieces are used to empirically measure the temperature of a workpiece, which is then assumed to be representative of all workpieces. However, in some embodiments, determination of an actual temperature of a workpiece being processed, and not a test workpiece, may be advantageous.

Thus, any system or method that allows for measurement of the temperature of a workpiece as that workpiece is being processed would be beneficial. Further, it would be advantageous if the measurement could occur while the workpiece is undergoing other processes, so as to maximize throughput.

SUMMARY

An improved system and method of measuring the temperature of a workpiece being processed is disclosed. The temperature measurement system determines a temperature of a workpiece by measuring the amount of expansion in the workpiece due to thermal expansion. The amount of expansion may be measured using a number of different techniques. In certain embodiments, a light source and a light sensor are disposed on opposite sides of the workpiece. The total intensity of the signal received by the light sensor may be indicative of the dimension of the workpiece. In another embodiment, an optical micrometer may be used. In another embodiment, a light sensor may be used in conjunction with a separate device that measures the position of the workpiece.

According to one embodiment, a temperature measurement system is disclosed. A temperature measurement system comprises a light emitter; a light sensor; and a controller, in communication with the light sensor, configured to receive an output from the light sensor, and based on the output from the light sensor, to determine a temperature of a workpiece disposed between the light emitter and the light sensor. In certain embodiments, the controller compares the output from the light sensor to a predetermined value or to an initial value measured at an initial temperature to determine a change in a dimension of the workpiece, and uses a coefficient of thermal expansion of the workpiece to determine the temperature of the workpiece. In certain embodiments, the workpiece is translated by a movable member, and the temperature measurement system comprises a position sensor, in communication with the controller, indicating an amount of translation by the workpiece. In certain embodiments, the light emitter and the light sensor comprise an optical micrometer configured to measure a diameter of the workpiece. In certain embodiments, the controller determines the temperature of the workpiece while the workpiece is undergoing a process in a semiconductor manufacturing process, where the process may be one of orientation, ion implantation and transportation.

In another embodiment, an apparatus for measuring a temperature of a workpiece is disclosed. The apparatus comprises a rotating pedestal on which a workpiece may be disposed; a light emitter; a light sensor; and a controller in communication with the light sensor, wherein the light sensor continuously measures an amount of light received from the light emitter and outputs a plurality of values to the controller, and the controller determines a temperature of the workpiece disposed between the light emitter and the light sensor based on the plurality of values. In certain embodiments, the controller determines an average value of light received over a rotation of the workpiece based on the plurality of values, and compares the average value to a predetermined value to determine the temperature of the workpiece. In certain embodiments, a heater is disposed over the workpiece, and the controller uses the temperature of the workpiece to control the heater.

In another embodiment, an apparatus for measuring a temperature of a workpiece is disclosed. The apparatus comprises a first light emitter transmitting a first light beam; a first light sensor to receive the first light beam; a second light emitter transmitting a second light beam; a second light sensor to receive the second light beam; a scanning stage adapted to hold a workpiece, wherein the scanning stage translates the workpiece so that the workpiece interrupts the first light beam at a first point, wherein each point at which the first light sensor or the second light sensor detects a change in received light is defined as a workpiece edge detection point; a position sensor to measure movement of the scanning stage; and a controller in communication with the first light sensor, the second light sensor and the position sensor, and wherein the controller records three measurements from the position sensor at three workpiece edge detection points, and based on the three measurements from the position sensor, determines a temperature of the workpiece. In certain embodiments, the apparatus comprises a third light emitter and a third light sensor, wherein the controller records a measurement at a second point at which a third light beam received by the third light sensor is interrupted, uses the second point as one of the three workpiece edge detection points to determine the temperature of the workpiece. In certain embodiments, the apparatus comprises an ion source, where the workpiece is implanted with ions from the ion source while the scanning stage translates the workpiece.

BRIEF DESCRIPTION OF THE DRAWINGS

For a better understanding of the present disclosure, reference is made to the accompanying drawings, which are incorporated herein by reference and in which:

FIG. 6 shows a temperature measurement system according to a third embodiment.

DETAILED DESCRIPTION

As described above, the optical properties of silicon make the use of infrared techniques to measure absolute temperature of a workpiece being processed difficult. Emissivity is a measure of a material's ability to emit energy via radiation. At certain temperatures, silicon emissivity changes rapidly and makes the use of infrared imaging an unstable technique to accurately measure the absolute temperature. As the temperature of the silicon increases, the emissivity of the silicon also increases. At 800° C., the emissivity of silicon is nearly constant at close to 0.7. This optical behavior is problematic for several reasons.

Thus, the use of a different temperature measurement technique may be beneficial, especially one that does not rely on infrared measurements.

It is known that most materials experience changes in size when heated due to thermal expansion. The rate at which a material expands as a function of temperature is referred to as the material's coefficient of thermal expansion (CTE). This expansion in the dimension of the workpiece can be used to determine the actual temperature of the workpiece. Advantageously, this technique may be used while the workpiece is being subjected to certain processes. In other words, in certain embodiments, the temperature of the workpiece may be determined while the workpiece is being subjected to another process which is part of the semiconductor manufacturing process.

Figure 1:
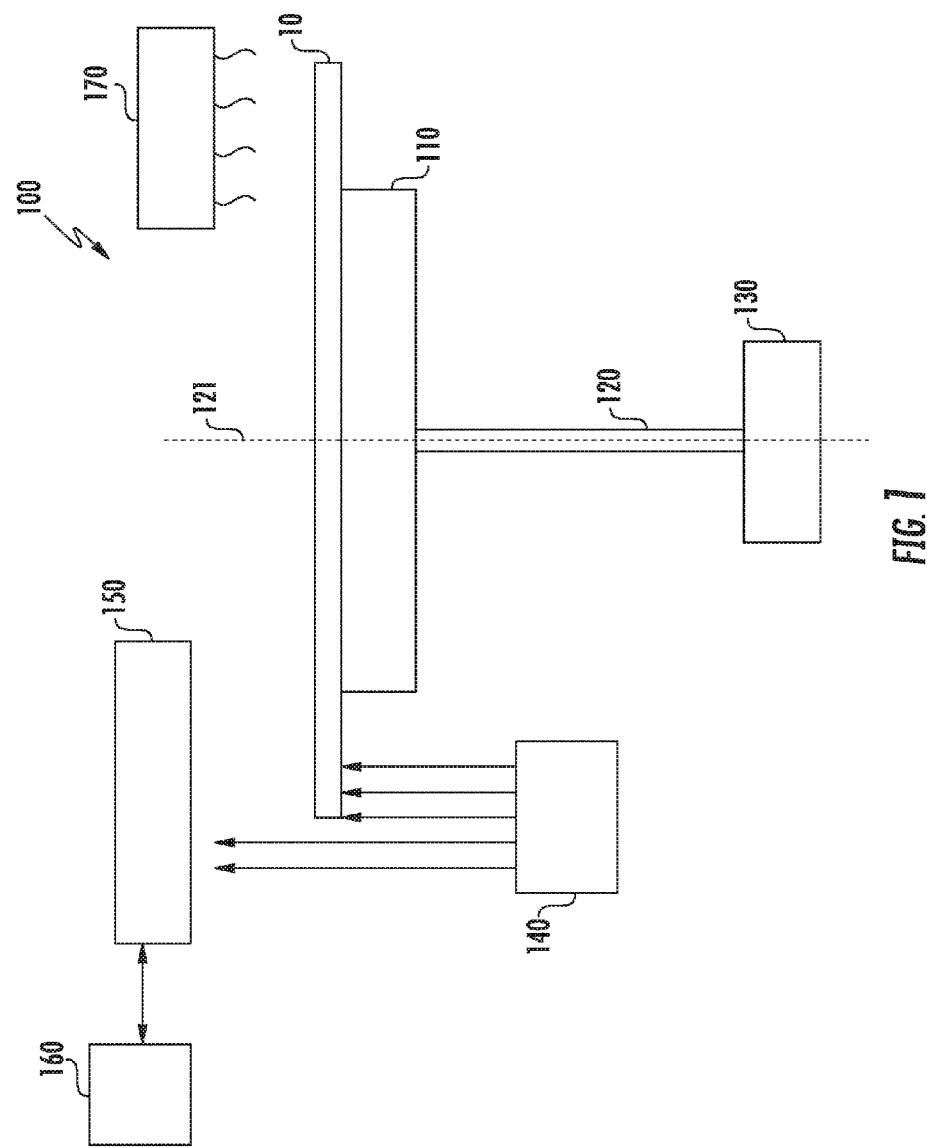
FIG. 1 is a temperature measurement system according to one embodiment.

FIG. 1 shows a temperature measurement system 100 according to one embodiment. The temperature measurement system 100 may be incorporated into the workpiece orienter, which is commonly used in semiconductor processing. A workpiece 10 may be disposed on an orienter pedestal 110. The orienter pedestal 110 is in communication with a shaft 120, which, in turn, is in communication with a motor 130. The motor 130 is used to rotate the shaft 120, which causes rotation of the orienter pedestal 110 and the workpiece 10 about an axis of rotation 121. The workpiece 10 may have a notch disposed along its outer circumference. A light emitter 140 is used to emit light toward a light sensor 150. While FIG. 1 shows the light emitter 140 disposed below the workpiece 10 with the light sensor 150 disposed above the workpiece 10, other embodiments are also possible. For example, the light emitter 140 may be disposed above the workpiece 10 with the light sensor disposed below the workpiece 10.

A controller 160 may be in communication with the light sensor 150. The controller 160 may include a processing unit, such as a microcontroller, a personal computer, a special purpose controller, or another suitable processing unit. The controller 160 may also include a non-transitory storage element, such as a semiconductor memory, a magnetic memory, or another suitable memory. This non-transitory storage element may contain instructions and other data that allows the controller 160 to perform the functions described herein.

The controller 160 may also be in communication with the motor 130 so as to receive information about the rotational position of the workpiece 10 as the workpiece 10 is being rotated.

In operation, the light emitter 140 emits light toward the light sensor 150, which measures the amount of light being received. For example, the light sensor 150 may output a signal, analog or digital, which is representative of the amount of light received. When the notch is disposed between the light emitter 140 and the light sensor 150, the amount of light received by the light sensor 150 increases sharply, since the workpiece 10 is not blocking the light from the light emitter 140 to the same extent. In this way, the workpiece 10 can be oriented with its notch disposed at a predetermined angular or rotational position.

Figure 2:
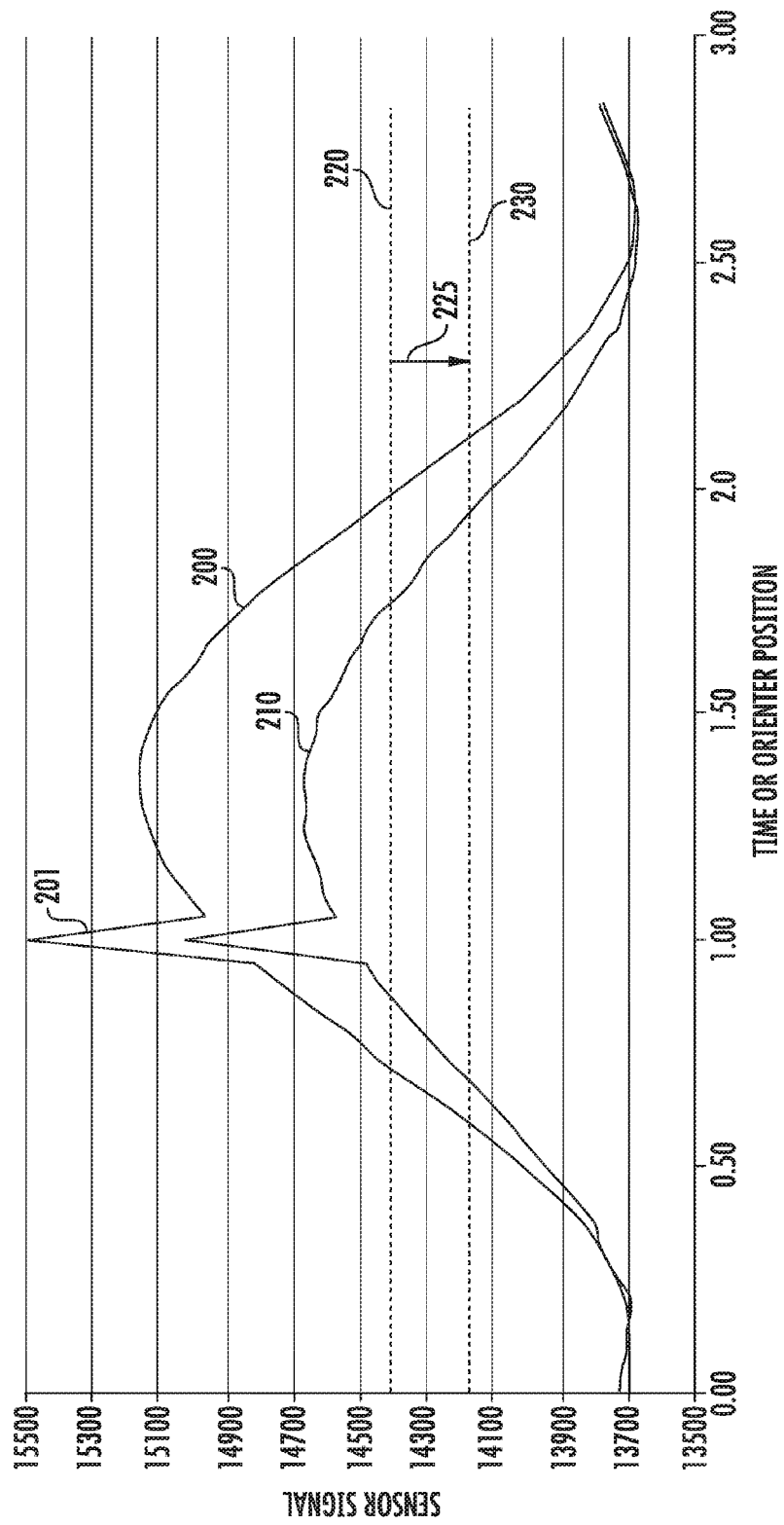
FIG. 2 shows the signal intensities measurements using the temperature measurement system of FIG. 1.

However, in addition to detecting this spike in the amount of light received, the light sensor 150 also senses the amount of light received during the rest of the workpiece's rotation. For example, if the center of the workpiece 10 was perfectly concentric with the axis of rotation 121, the amount of light received by the light sensor 150 would be the same throughout the rotation, with the exception of the notched region. However, if the center of the workpiece is not perfectly concentric with the axis of rotation 121, the amount of light received by the light sensor 150 will vary with rotational angle, such as is shown in FIG. 2. Line 200 shows the output of the light sensor 150, which represents the amount of light received by the light sensor 150 as a function of time, or rotational position. As described above, in this figure, the center of the workpiece 10 is not aligned to the axis of rotation 121. Additionally, the line 200 also has a spike 201 in the amount of light received at a rotational position corresponding to the notch in the workpiece 10.

In one example, the workpiece 10 is then heated. The workpiece 10 may be heated using a heater 170, such as a radiative heater, which may be disposed above the workpiece 10. This heated workpiece has a larger diameter than the original workpiece. The larger diameter implies that more light from the light emitter 140 will be blocked by the workpiece, resulting in less light reaching the light sensor 150. Line 210 shows the light received by the light sensor 150 when the workpiece is heated. The difference between these two lines 200, 210 is representative of the temperature increase in the workpiece. Line 220 shows the mean value of the line 200, averaged over an entire rotation. Line 230 shows the mean value of line 210, averaged over an entire rotation. The mean value may be calculated in a number of different ways. In one embodiment, the value received by the controller 160 from light sensor 150 is integrated and averaged over one or more rotations. In another embodiment, the greatest value received by the light sensor 150 and the lowest value received by the light sensor 150 are averaged by the controller 160. In certain embodiments, the effect of the notch is removed from the calculation of the mean value by the controller 160. The difference 225 between the two lines 220, 230 is indicative of the temperature increase. For example, the change in the amount of light received is proportional to the change in the diameter of the workpiece. Similarly, the change in the diameter is proportional to the change in temperature. Thus, by using the controller 160 to calculate and measure the change in mean value, the temperature increase in the workpiece can be calculated.

In one embodiment, the controller 160 may contain a mean value ($M_{pre}$) associated with a workpiece at a predetermined temperature ($T_{pre}$) such as 25° C. The controller 160 then subtracts the actual mean value ($M_{final}$), as measured by the light sensor 150 and the controller 160, from this predetermined mean value ($M_{pre}$). This difference is then multiplied by a first constant ($C_{ratio}$) which represents the ratio between the output of the light sensor 150 and the physical dimension of the workpiece. This result represents the change in the physical size of the workpiece, as compared to a workpiece at the predetermined temperature ($T_{pre}$). This first result is then multiplied by a second constant ($C_{TE}$), which may be the coefficient of thermal expansion for the workpiece. This second result is the temperature change of the workpiece, based on the measured change in dimension. This second result is then added to the predetermined temperature ($T_{pre}$) to yield the actual temperature ($T_{final}$) of the workpiece. In other words, $$T_{final} = T_{pre} + C_{TE} * C_{ratio} * (M_{pre} - M_{final})$$

In another embodiment, rather than using a stored mean value, the controller 160 measures the dimension of the workpiece at two points in time, where a heating cycle is performed, such as by using the heater 170, between these two points in time. In this way, rather than using a nominal value for the initial size of the workpiece, the actual size of the workpiece, prior to heating, is used. For example, the ambient environment ($T_{amb}$) may be known. A measurement ($M_{amb}$) is made using the temperature measurement system 100 at this ambient temperature ($T_{amb}$). These two values are then used in place of the predetermined values in the previous equation, while all subsequent calculations are as described above. In other words, $$T_{final} = T_{amb} + C_{TE} * C_{ratio} * (M_{amb} - M_{final})$$

In another embodiment, the controller 160 may include a table that maps a set of mean values to corresponding workpiece temperatures.

This temperature calculation made by the controller 160 may then be used for other purposes. For example, the controller 160 may be in communication with the heater 170, such that the controller 160 determines the amount of heat to be emitted by the heater 170 to achieve and maintain the desired temperature for the workpiece 10. In another embodiment, the controller 160 determines when the orienting process is terminated, based on the temperature of the workpiece 10.

Thus, the controller 160 associated with the orienter can be used to not only determine the orientation of the workpiece, but also determine the change in the diameter of the workpiece, which in turn allows for a determination of the temperature of the workpiece. In certain embodiments, the orienter can be used to preheat the workpiece to a particular temperature by using the information determined by the controller 160. Further, these measurements are made during processes which are already part of the semiconductor manufacturing process. In this way, the temperature measurement does not add any time or complexity to the existing semiconductor manufacturing process.

Figure 3:
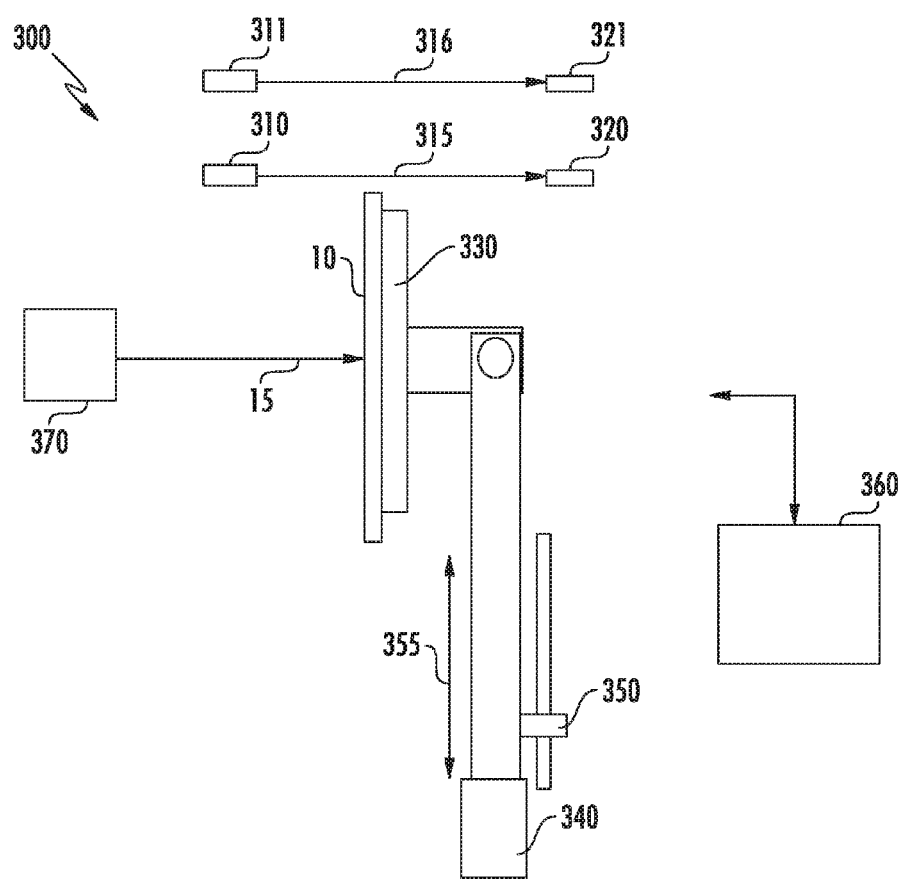
FIG. 3 shows a temperature measurement system according to a second embodiment.

Other embodiments are also possible. For example, FIG. 3 shows a temperature measurement system 300 that includes a scanning stage 340 that may be used for an ion implanter. A chuck 330, such as an electrostatic chuck, is disposed on one end of the scanning stage 340. The scanning stage 340 is adapted to move at least in scanning direction 355. Movement in scanning direction 355 may be measured using position sensor 350, such as a linear encoder. Other measurement means may also be used to measure the position or movement in scanning direction 355.

In operation, a workpiece 10 is disposed on the chuck 330. An ion beam 15, which is generated by an ion source 370, is directed toward the workpiece 10. The scanning stage 340 moved in scanning direction 355 so as to expose all portions of the workpiece 10 to the ion beam 15.

Figure 4A:
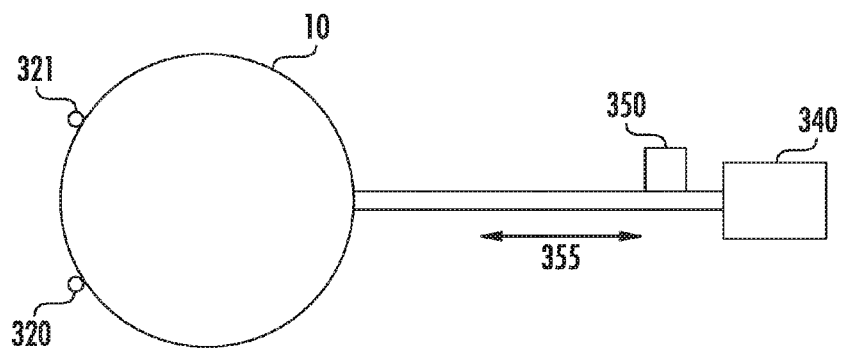
FIGS. 4A-4B show a front view of the temperature measurement system of FIG. 3 using two light sensors.
Figure 4B:
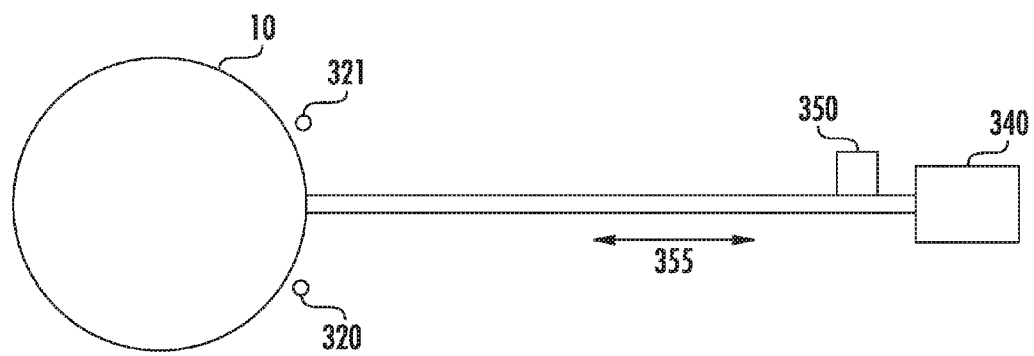

The temperature measurement system 300 includes a first light emitter 310 that emits a first light beam 315, a first light sensor 320 to receive the first light beam 315, a second light emitter 311 that emits a second light beam 316, a second light sensor 321 to receive the second light beam 316 and a controller 360. FIG. 4A-4B shows a front view of the temperature measurement system 300. As best seen in FIG. 4A, the first light sensor 320 and the second light sensor 321 are each disposed such that the first light beam 315 and the second light beam 316 scan different parts of the workpiece 10 as the workpiece is translated in the scanning direction 355.

The controller 360 may include a processing unit, such as a microcontroller, a personal computer, a special purpose controller, or another suitable processing unit. The controller 360 may also include a non-transitory storage element, such as a semiconductor memory, a magnetic memory, or another suitable memory. This non-transitory storage element may contain instructions and other data that allows the controller 360 to perform the functions described herein.

FIG. 4A shows a front view of the workpiece 10 and the scanning stage 340 where the workpiece 10 has not yet reached the first light sensor 320 or the second light sensor 321. In this embodiment, the first light sensor 320 and the second light sensor 321 are disposed in known positions. The first light sensor 320 and the second light sensor 321 may be disposed such that the first light beam 315 and second light beam 316 scan different parts of the workpiece 10 as the workpiece 10 is translated. As the workpiece 10 moves along the scanning direction 355, there will be a first data point where first light sensor 320 no longer receives the first light beam 315 from first light emitter 310. There will also be a second data point where second light sensor 321 no longer receives the second light beam 316 from second light emitter 311. As the workpiece 10 continues moving, the workpiece 10 will pass the first light sensor 320 and the second light sensor 321, as shown in FIG. 4B. Thus, there will be a third data point where the first light sensor 320 again receives the first light beam 315 from first light emitter 310. Similarly, there will be a fourth data point where the second light sensor 321 again receives the second light beam 316 from second light emitter 311. These data points may be referred to as workpiece edge detection points. A workpiece edge detection point is a point at which there is a large change in the output of the light sensors. This change may be caused by the interrupt of a light beam by the workpiece 10, or may be caused by the movement of the workpiece 10 so that the workpiece 10 no longer interrupts a light beam. In other words, these workpiece edge detection points are indicative of the outer edge of the workpiece 10.

The exact physical locations of the first light sensor 320 and second light sensor 321 are known. Additionally, the outputs of the position sensor 350, which represent position measurements at each of the workpiece edge detection data points, are also known. It is well known that the center and radius of a circle may be calculated based on any three points. Thus, by using any three of these four workpiece edge detection points, the radius of the workpiece 10 may be determined. The radius of the workpiece 10 can then be used to determine the temperature of the workpiece 10.

Specifically, once the radius of the workpiece 10 has been determined, this information can be used by the controller 160 to determine a temperature of the workpiece 10. In one embodiment, the controller may contain a table or equation which correlates a radius to a temperature. In another embodiment, the controller 160 may have information about the radius of the workpiece at a predetermined temperature. Using the coefficient of thermal expansion of the workpiece and the change in radius, it is then possible to determine the change in temperature. When this change in temperature is added to the predetermined temperature, the actual temperature of the workpiece can be determined. The techniques used to determine the temperature of the workpiece 10 may be similar to those described above with respect to FIG. 1.

In embodiments where the temperature of the workpiece 10 is periodically measured, this measurement could provide feedback to the chuck 330. For example, the chuck 330 may have heating elements embedded therein. The amount of heat emitted by the heating elements in the chuck 330 may be controlled based on the measured temperature of the workpiece 10. In this way, the heat applied to the workpiece 10 may be controlled in a closed loop fashion.

When two light emitters and two light sensors are used, only three of the four workpiece edge detection points may be used to determine the radius of the workpiece 10.

While FIG. 3 shows the first light emitter 310 and the second light emitter 311 disposed on the same side of the workpiece 10 as the ion source 370, other embodiments are also possible. For example, the first light sensor 320 and the second light sensor 321 may be disposed on the same side of the workpiece 10 as the ion source 370. In other words, any configuration in which the light emitters and their respective light sensors are disposed on opposite sides of the workpiece 10 is possible.

Figure 5A:
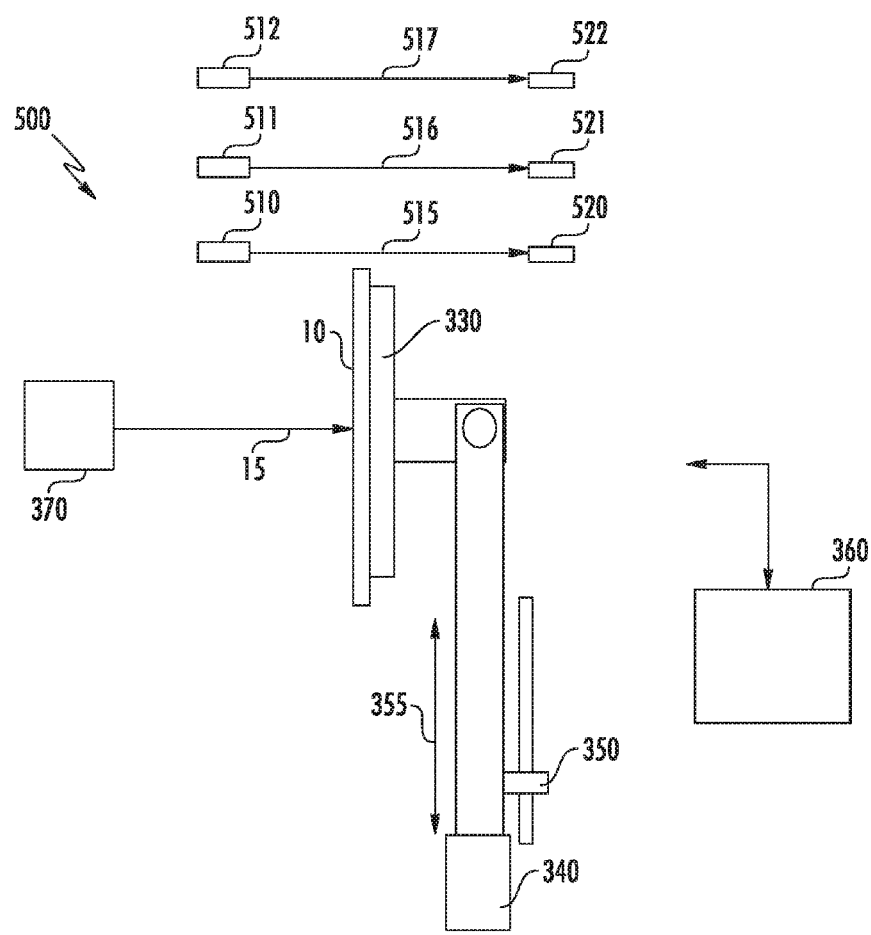
FIGS. 5A-B shows a side view and a front view of the temperature measurement system of FIG. 3 using three light sensors.
Figure 5B:
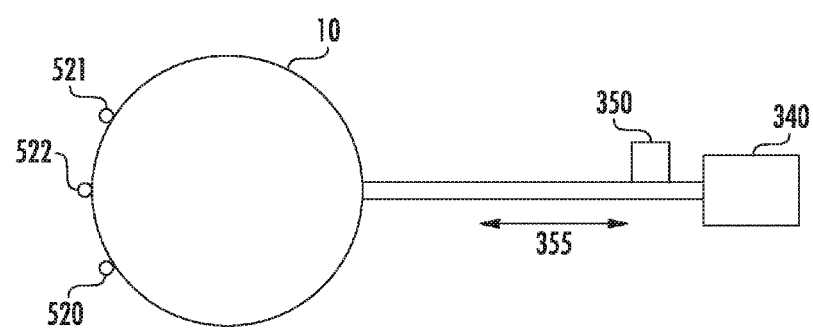

While the above description describes embodiments having two light sensors, other embodiments are also possible. For example, as shown in FIGS. 5A-5B, the temperature measurement system 500 may include three or more light emitters 510, 511, 512 and respective light sensors 520, 521, 522 may be used. Workpiece edge detection points may be recorded from this plurality of light sensors 520, 521, 522. A minimum of three workpiece edge detection points may be used to determine the radius of the workpiece 10. For example, the point at which each light sensor 520, 521, 522 can no longer receive the respective light beam 515, 516, 517 may be used as the workpiece edge detection points. Alternatively, the point at which each light sensor 520, 521, 522 again received the respective light beam 515, 516, 517 after the workpiece passes may be used as the workpiece edge detection points. Further, any combination of these workpiece edge detection points may be used.

For example, in one embodiment, three light emitters 510, 511, 512 and three corresponding light sensors 520, 521, 522 are used. Each is disposed in a known location. As the workpiece 10 is translated, the controller 160 records three measurements from the position sensor 350, which correspond to the points at which the workpiece 10 interrupts each of the three light beams 515, 516, 517. The three measurements are used as the workpiece edge detection points, and are used to determine a radius of the workpiece 10. In this way, the scanning stage 340 does not have to translate the workpiece 10 past the light sensors 520, 521, 522, as was done in FIG. 4B.

Further, while the above description describes a scanning stage, it is understood that this embodiment is applicable to any configuration where the workpiece is translated by a movable member, where the translation of the workpiece 10 may be measured by a position sensor 350.

In any of these embodiments, it may be beneficial to position the light emitters and the light sensors at locations where they do not interfere with the normal operation of the ion implanter.

FIG. 6 shows another embodiment of a temperature measurement system 400. A workpiece 10 may be disposed on a carrier 410. The carrier 410 may be, for example, a conveyor belt, a robotic arm or another conveying mechanism. Light arrays 420a, 420b may be disposed on either side of the carrier 410. In certain embodiments, the light arrays 420a, 420b may be disposed beneath the workpiece 10.

Light sensors 430a, 430b may be disposed above the workpiece 10 in alignment with the light arrays 420a, 420b, respectively. The light arrays 420a, 420b and light sensors 430a, 430b may form two optical micrometers. A controller 440 is also in communication with the light sensors 430a, 430b. The controller 440 may include a processing unit, such as a microcontroller, a personal computer, a special purpose controller, or another suitable processing unit. The controller 440 may also include a non-transitory storage element, such as a semiconductor memory, a magnetic memory, or another suitable memory. This non-transitory storage element may contain instructions and other data that allows the controller 440 to perform the functions described herein.

As the workpiece 10 is carried by the carrier 410, it breaks parts of the light beams 425a, 425b. The light sensors 430a, 430b, in conjunction with the controller 440, may determine the diameter of the workpiece 10 as it is carried by the carrier 410. The light sensors 430a, 430b each record the position at which the light beams 425a, 425b are broken. By adding these values to the known distance between the light sensors 430a, 430b, the diameter of the workpiece 10 may be accurately measured. This measured value may be compared to the nominal or an initial value of the diameter of the workpiece. The difference between the actual diameter and the nominal or initial diameter is then multiplied by the coefficient of thermal expansion of the material to determine the increase in temperature. When added to the initial temperature, the actual temperature of the workpiece 10 can be determined. Alternatively, the measured value may be used to index into a table stored in the controller 440 which correlates measured value to workpiece temperature.

In certain embodiments, a heater (not shown) may be disposed above the carrier 410. The controller 440 may be in communication with the heater so as to control the heater to insure that the workpiece 10 is maintained at a desired temperature. The controller 440 may increase or decrease the heat supplied by the heater based on the diameter measurement of the workpiece 10 as it passes between the light arrays 420a, 420b and the light sensors 430a, 430b.

In all of these embodiments, the controller is able to determine a temperature of the workpiece 10 based on a physical measurement of the workpiece 10. By accurately determining the size of the workpiece 10, and knowing the coefficient of thermal expansion of the material used to produce the workpiece, the temperature of the workpiece 10 may be accurately determined. Further, in certain embodiments, the dimensions of the workpiece are determined during existing processes, such as orientation, ion implantation and transportation.

The temperature measurement system may serve many functions. In certain embodiments, the temperature measurement system may be used to provide feedback to a workpiece heating system, which is responsible for maintaining the workpiece at a predetermined temperature. This heating system may include the chuck on which the workpiece is disposed, external heat lamps, or other heating elements. The temperature measurement system may also be used as a validation tool which is used to verify that the workpiece was processed at the desired temperature.

The embodiments described herein have many advantages. First, the embodiments disclosed herein do not rely on infrared measurements. As described above, infrared measurements may be unreliable for certain materials, such as silicon. Thus, the use of a different technique may result in more accurate temperature measurements. Second, the embodiments described herein may be performed while the workpiece is undergoing other processes. In this way, the temperature measurement does not add time or complexity to the semiconductor manufacturing process, and throughput is not compromised. Third, these temperature measurement systems may be used to empirically calculate the temperature of a workpiece as the workpiece is subjected to certain processes. In prior systems, the temperature of the workpiece, as it undergoes various processes, may be estimated based on theoretical or test data. These temperature measurement systems allow more accurate results. Fourth, these temperature measurement systems may also be used to regulate the temperature of the workpiece during these processes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for measuring a temperature of a workpiece, comprising:
   a first light emitter transmitting a first light beam;
   a first light sensor to receive the first light beam;
   a second light emitter transmitting a second light beam;
   a second light sensor to receive the second light beam;
   a scanning stage adapted to hold a workpiece, wherein the scanning stage translates the workpiece so that the workpiece interrupts the first light beam at a first point, wherein each point at which the first light sensor or the second light sensor detects a change in received light is defined as a workpiece edge detection point;
   a position sensor to measure movement of the scanning stage;
   and
   a controller in communication with the first light sensor, the second light sensor and the position sensor, and wherein the controller records three measurements from the position sensor at three workpiece edge detection points, and based on the three measurements from the position sensor, determines a temperature of the workpiece.

2. The apparatus of claim 1, wherein the second light beam is interrupted by the workpiece at a second point, and the scanning stage continues translating the workpiece until the first light beam is no longer interrupted by the workpiece at a third point, and the second light beam is no longer interrupted by the workpiece at a fourth point, and wherein the controller uses three points selected from the group consisting of the first point, the second point, the third point and the fourth point as the three workpiece edge detection points to determine the temperature of the workpiece.

3. The apparatus of claim 1, comprising a third light emitter and a third light sensor, wherein the controller records a measurement at a second point at which a third light beam received by the third light sensor is interrupted, and uses the second point as one of the three workpiece edge detection points to determine the temperature of the workpiece.

4. The apparatus of claim 1, further comprising an ion source, where the workpiece is implanted with ions from the ion source while the scanning stage translates the workpiece.

5. The apparatus of claim 1, wherein the workpiece is disposed on a platen and heating elements are embedded in the platen.

6. The apparatus of claim 5, wherein an amount of heat emitted by the heating elements is based on the temperature of the workpiece.

7. An apparatus for measuring a temperature of a workpiece, comprising:
   a first light emitter transmitting a first light beam;
   a first light sensor to receive the first light beam;
   a second light emitter transmitting a second light beam;
   a second light sensor to receive the second light beam;
   a third light emitter transmitting a third light beam;
   a third light sensor to receive the third light beam;
   a scanning stage adapted to hold a workpiece, wherein the scanning stage translates the workpiece, and wherein each point at which the first light sensor, the second light sensor or the third light sensor detects a change in received light is defined as a workpiece edge detection point;
   a position sensor to measure movement of the scanning stage;
   and
   a controller in communication with the first light sensor, the second light sensor, the third light sensor and the position sensor, and wherein the controller records three measurements from the position sensor at three workpiece edge detection points, and based on the three measurements from the position sensor, determines a temperature of the workpiece.

8. The apparatus of claim 7, wherein the workpiece interrupts the first light beam at a first point, interrupts the second light beam at a second point, and interrupts the third light beam at a third point, and the controller records the three measurements from the position sensor at the first point, the second point and the third point.

9. The apparatus of claim 7, further comprising an ion source, where the workpiece is implanted with ions from the ion source while the scanning stage translates the workpiece.

10. The apparatus of claim 7, wherein the workpiece is disposed on a platen and wherein heating elements are embedded in the platen.

11. The apparatus of claim 10, wherein an amount of heat emitted by the heating elements is based on the temperature of the workpiece.

* * * * *